United States Patent
Feldtkeller et al.

[11] 4,070,620
[45] Jan. 24, 1978

[54] MAGNETO-OPTICAL HIGH-VOLTAGE CURRENT MEASURING TRANSDUCER

[75] Inventors: Ernst Feldtkeller; Hauke Harms; Alfred Papp, all of Munich, Germany

[73] Assignee: Siemens Aktiengesellschaft, Berlin and Munich, Germany

[21] Appl. No.: 712,759

[22] Filed: Aug. 9, 1976

[30] Foreign Application Priority Data

Sept. 15, 1975 Germany .............................. 2541072

[51] Int. Cl.² ............................................ G01R 31/00
[52] U.S. Cl. ...................................... 324/96; 350/151; 350/157
[58] Field of Search .................. 324/96; 350/151, 157; 250/199

[56] References Cited
U.S. PATENT DOCUMENTS
3,769,584   10/1973   Iten et al. ............................... 324/96

*Primary Examiner*—Stanley T. Krawczewicz
*Attorney, Agent, or Firm*—Hill, Gross, Simpson, Van Santen, Steadman, Chiara & Simpson

[57] ABSTRACT

A magneto-optical measuring transducer for measuring high-voltage currents has a measuring sensing element positioned adjacent a conductor carrying the high-voltage currents to be measured. The sensing element is designed as a pair of similar and adjacent light conducting coils. The polarization plane of linearly polarized light within the coils is rotated according to the strength of a magnetic field produced by the current in the adjacent conductor. A compensator is also provided comprising a pair of light conducting coils. The compensator is spaced from and optically connected to the measuring sensing element. A variable magnetic field is provided adjacent the compensator and the change in polarization of light waves conducted within the compensator is detected by a detector and compared to the polarization of light fed through the measuring sensing element.

7 Claims, 2 Drawing Figures

MAGNETO-OPTICAL HIGH-VOLTAGE CURRENT MEASURING TRANSDUCER

BACKGROUND OF THE INVENTION

1. Field of the Invention

The invention relates to a magneto-optical high-voltage current measuring transducer and more particularly to a measuring transducer utilizing light polarization changes created by a magnetic field associated with the high-voltage current.

2. Description of the Prior Art

Magneto-optical measuring transducers are known. In a known measuring transducer, polarized light flows through a first Faraday rotator which is arranged as a measuring sensing element in a magnetic field which is dependent upon the high-voltage current to be measured. On the passage through this Faraday rotator, the polarization direction of a polarized light beam is rotated in dependence upon the magnetic field. The polarized light which emerges from the Faraday rotator and is altered in respect of its polarization direction, now passes through another Faraday rotator, the so-called compensator, which carries earth potential. The compensator is connected to a regulatable magnetic field so that the polarized light, which has been altered in respect of its polarization direction is returned to the original polarization direction. The strength of the regulatable magnetic field is then consequently a gauge for the current strength of the current to be measured.

It is already known to design a Faraday rotator as a light conducting coil. A light conducting coil of this type consists of a glass fibre which serves to convey the polarized light beam, whereby the polarization direction of this light beam is rotated on its path through the glass fibre in dependence upon the prevailing magnetic field.

Such Faraday rotators in the form of light conductor coils have limited measuring accuracy, however. As a result of the curvature of the light conductor fibres in the coil, unsymmetries arise which cause birefringence.

It is known how this curvature-dependent birefringence can be compensated. The starting point is the recognition that in terms of their influence on polarized light, coils composed of light conducting fibres can be described by way of a model as a birefringent crystal. For reasons of symmetry, a main axial direction is identical with the coil axis. In a birefringent crystal, main axial directions are to be understood as those directions of polarization in which a linearly polarized light beam can pass through the crystal without the polarization of the light beam becoming altered.

Each birefringent crystal possesses two main axial directions which are at right angles to one another. If it is traversed by a linearly polarized light beam exhibiting a polarization direction which differs from the main axial direction, elliptically polarized light is formed. If two similar crystals are optically connected in series to one another in such manner that the direction of the main axis with the more rapid light propagation in the one crystal is identical to the direction of the main axis with the slower light propagation in the other crystal, i.e. if the similar main axial directions are crossed, the differences in transit time for different polarization directions are compensated, so that a linearly polarized light beam which enters this crystal combination emerges linearly polarized again, and in fact independently of its polarization direction.

On the basis of this knowledge, it has been proposed that two identical light conductor coils be optically connected in series, the coil axes to be aligned at right angles to one another. The one light conductor coil serves as a measuring sensing element and carries a high voltage potential, whereas the other light conductor coil serves as a compensator and carries earth potential. In this arrangement the curvature-dependent birefringence can be compensated.

However, the strength of the curvature-dependent birefringence is also temperature-dependent and as the measuring sensing element and the compensator are generally relatively widely spaced from one another in order to achieve insulation from the high voltage current to be measured, it is difficult to ensure an equal temperature on the measuring sensing element and on the compensator.

SUMMARY OF THE INVENTION

Accordingly, it is an object of this invention to provide means for suppressing temperature influences.

This object is achieved by providing a pair of light conducting coils arranged at right angles and adjacent one another for the measuring sensing element and/or the compensator.

Thus in the measuring transducer of the invention, the measuring sensing element exhibits two similar light conductor coils, whose coil axes are approximately at right angles to one another. As the light conductor coils of the measuring sensing element are arranged closely adjacent to one another, these coils are subject to the same temperature influences.

An advantageous embodiment of the measuring transducer possesses light conductor fibres with a liquid core.

Light conductor fibres with liquid core possess the advantage, compared to glass fibres, that remaining production-related mechanical tensions do not occur. This is because in the production of glass fibres, irregular mechanical tensions arise within the glass fibre and it is not possible to predetermine the strength of these tensions. Thus fibres of this type possess a production-governed birefringence which is also temperature-dependent.

Light conductor fibres with a liquid core, on the other hand, exhibit a birefringence which, apart from negligible influences of mechanical surface tensions and asymmetry of the light conductor casing, is clearly coupled to the curvature of the light conductor fibre.

The aforementioned side effects of the light conductor casing can also be compensated. For such compensation, an adjustment is provided by which the coil axes can be brought somewhat out of the direction in which they are at right angles to one another. The precise setting must be determined by experiment.

It is advantageous if a compensator composed of two similar light conductor coils is also provided, where the coil axes are arranged approximately at right angles to one another.

DESCRIPTION OF THE PREFERRED EMBODIMENTS

Figure 1:
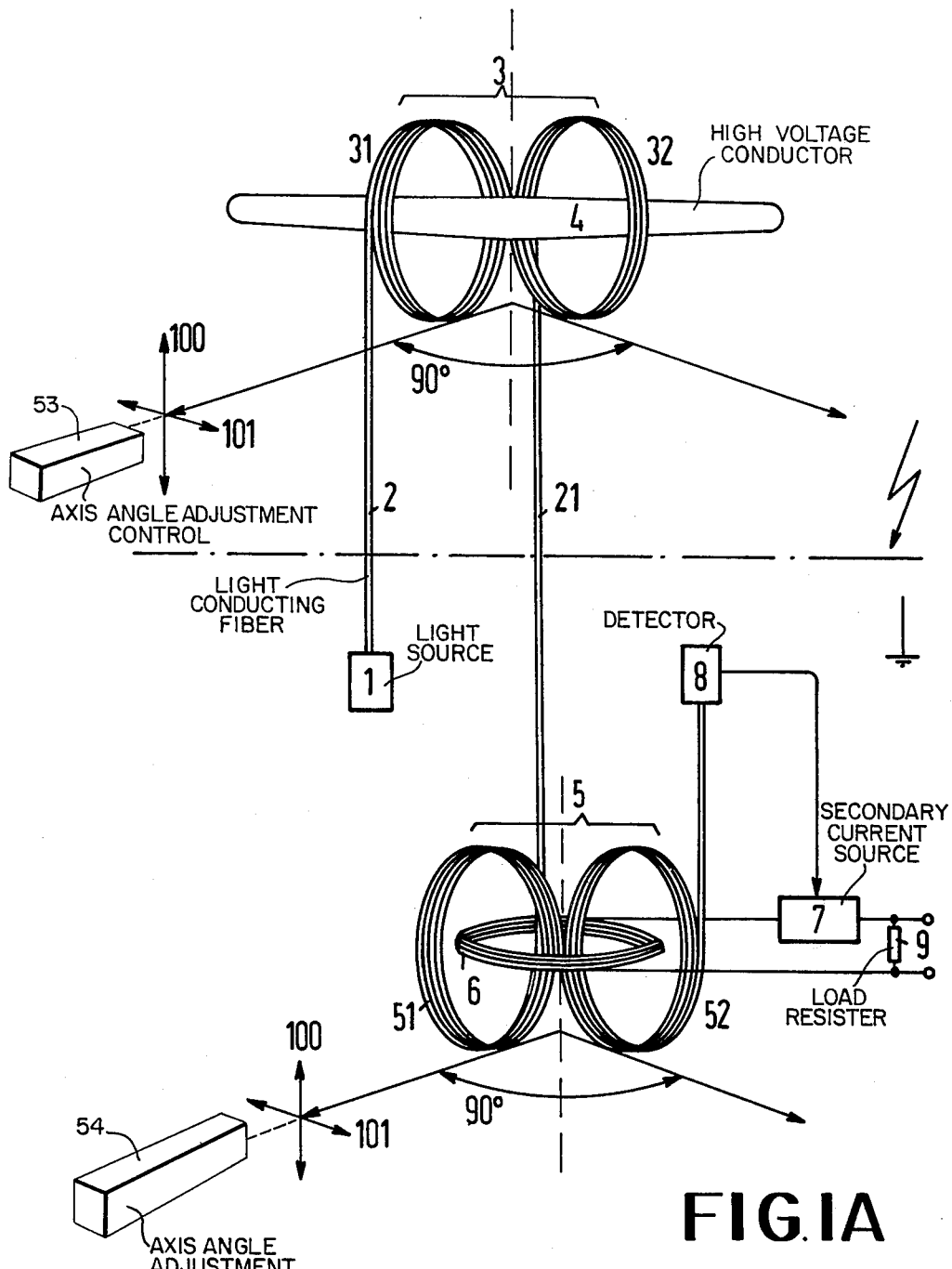
FIG. 1 is a perspective view illustrating a magneto-optical measuring transducer of this invention having a spaced apart measuring sensing element and compensator.
Figure 1A:
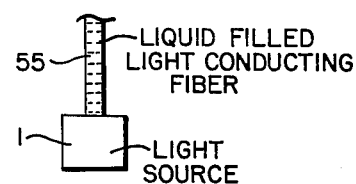
FIG. 1A is a fragmentary view illustrating use of a liquid filled fibre optic cable in the invention.

A light source 1 which carries earth potential and which can, for example, be a laser, produces a linearly polarized light beam which is conveyed through a light conductor fibre 2. This light conductor fibre leads to a measuring sensing element 3 which possesses two light conductor coils 31, 32. These two light conductor coils are of as similar a construction as possible and exhibit coil axes which are virtually at right angles to one another. The measuring sensing element is arranged in the region of a magnetic field which is produced by the high-voltage current to be measured, and in the representative example this magnetic field is produced by a high voltage conductor 4 through which flows a portion of the high-voltage current to be measured. The light conductor coil 32 is optically connected via a light conductor fibre 21 to a compensator 5 which in turn comprises two light conductor coils 51, 52 whose coil axes are approximately at right angles to one another. This compensator is arranged in the region of a compensating magnetic field which is produced by means of a secondary current source 7 connected to a coil 6. The current strength of the secondary current source is regulated in such manner that on the detector 8 the incoming light beam exhibits the same direction of polarization as at the light source 1. It is thus possible to tap from a load resistor 9 an alternating voltage which is a gauge for the high-voltage current strength which is to be measured in the high voltage conductor 4.

The detector 8 can for example be constructed in the following known manner. By means of a Wollaston prism the incoming light beam is divided into two sub-beams which are polarized at right angles to one another and whose polarization directions form an angle of 45° with the polarization direction of the light beam produced by the light source 1. The two sub-beams, which are polarized at right angles to one another are each conveyed to a light measuring device so that the intensities of the sub-beams are measured. The ratio of the two intensities is then a gauge for the polarization direction of the light beam incoming to the detector 8. If the ratio of the intensities is equal to 1, the incoming light beam has the same polarization direction as at the light source 1.

For simplicity, the Figure illustrates symbolically by arrows 100, 101 and axis angle adjustment controls 53, 54 that on the light conductor coils of the measuring sensing element and the compensator it is advantageous to provide adjustment means with which the coil axes of these light conductor coils can be deflected somewhat out of their directions at right angles to one another in order to compensate the remaining birefringence error as described above. Such adjustment means may be provided by known prior art mechanical techniques.

However, a full compensation of the birefringence by series connected birefringent elements in which the similar main axes lie at right angles to one another is only possible when the birefringent elements are not simultaneously Faraday rotators in a magnetic field. In the publication Applied Optics 11 (1972) page 617–621, Jaecklin and Lietz have pointed out that the compensation of the birefringence by two flint glass blocks in the form of Faraday rotators is incomplete.

Advantageously in the measuring transducer in accordance with the invention, even under the effects of the magnetic fields it is possible to achieve a particularly high compensation of the birefringence if the light conductor fibres of the coils 31, 32 of the measuring sensing element each alternately form one turn on each of the two coil bodies i.e. if each coil turn is followed by a coil turn whose axis is at right angles to the axis of the preceding coil turn. This technique also applies to the coils 51, 52 of the compensator.

Light conductor fibres 55 with a liquid core are known per se, as indicated in the publication W. A. Gamblin, D. N. Payne, H. Matsumura, Electron. Lett. 10 (1974) p. 148–149 and may alternatively be employed in place of light conducting fiber 2 as shown in the drawing.

Light conductor fibres of this type possess a liquid core containing e.g. of hexachlorobuta - 1,3 - diene. The liquid core possesses an index of refraction $n_1 = 1.551$, and the glass casing e.g. an index of refraction $n_2 = 1.482$. Previously, however it was not suggested to arrange such fibres in measuring transducers.

Although various minor modifications may be suggested by those versed in the art, it should be understood that we wish to embody within the scope of the patent warrented hereon, all such embodiments as reasonably and properly come within the scope of our contribution to the art.

We claim as our Invention:

1. A magneto-optical measuring transducer for measuring high-voltage currents carried by a high-voltage conductor, comprising:
   a. a measuring sensing element adjacent the high-voltage conductor to be measured, said sensing element being designed as a light conducting coil means, the polarization plane of linearly polarized light therein being rotated in dependence upon the strength of a magnetic field produced by the currents to be measured, such rotation being related to the current being measured; and
   b. said light conducting coil means comprising at least one pair of similar and adjacent light conducting coils whose axes are at approximate right angles to one another.

2. A measuring transducer as claimed in claim 1 characterized in that a compensator is provided which is connected optically to the measuring sensing element via a light conducting fibre, said compensator having a pair of similar and adjacent light conducting coils whose axes are at approximate right angles to one another.

3. A measuring transducer as claimed in claim 1 characterized in that on the light conducting coils of said at least one pair adjustment means are provided with which the coil axes of the light conducting coils of the pair can be controllably aligned at directions other than at right angles to one another so that a remaining birefringence error of the light conducting coils is compensated.

4. Measuring transducer as claimed in claim 1 characterized in that for said at least one pair of the light conducting coils one winding of one light conducting coil of the pair is followed by a winding of the other light conducting coil of the pair.

5. Measuring transducer as claimed in claim 1 characterized in that the light conducting coils consist of light conducting fibres with a liquid core.

6. A magneto-optical measuring transducer for measuring high-voltage currents on a conductor, comprising:

a. a measuring sensing element comprising a pair of similar and adjacent light conducting coils whose axes are at approximate right angles to one another, the conductor passing through said pair of coils;
b. a light source connected to said measuring sensing element;
c. a compensator comprising a pair of similar and adjacent light conducting coils whose axes are at approximate right angles to one another, said compensator being displaced from and optically connected with said measuring sensing element;
d. detection means connected to said compensator; and
e. adjustable magnetic field means adjacent said compensator.

7. The transducer of claim 6 in which at least one of said pairs of light conducting coils has an adjustable angle between the adjacent coils by use of adjustment means to compensate for birefringence error of the light conducting coils.

* * * * *